US005883543A

United States Patent [19]
Weber

[11] Patent Number: 5,883,543
[45] Date of Patent: Mar. 16, 1999

[54] CIRCUIT CONFIGURATION FOR GENERATING A REFERENCE POTENTIAL

[75] Inventor: Stephan Weber, München, Germany

[73] Assignee: Siemens Aktiengesellschaft, Munich, Germany

[21] Appl. No.: 855,842

[22] Filed: May 12, 1997

[30] Foreign Application Priority Data

May 10, 1996 [DE] Germany ........................ 196 18 914.4

[51] Int. Cl.[6] ........................ H03K 3/38

[52] U.S. Cl. ........................ 327/530; 323/313; 323/315

[58] Field of Search ........................ 323/312, 313, 323/315; 327/530, 538, 540, 542

[56] References Cited

U.S. PATENT DOCUMENTS

| | | | |
|---|---|---|---|
| 4,553,083 | 11/1985 | Yang | 323/313 |
| 5,028,527 | 7/1991 | Poletto et al. | 327/530 |
| 5,029,295 | 7/1991 | Bennett et al. | 323/313 |
| 5,719,522 | 2/1998 | Saitou et al. | 327/540 |
| 5,757,224 | 5/1998 | Antone et al. | 323/315 |

FOREIGN PATENT DOCUMENTS

| | | |
|---|---|---|
| 0 411 657 | 2/1991 | European Pat. Off. . |
| 2 256 949 | 12/1992 | United Kingdom . |

OTHER PUBLICATIONS

Paul R. Gray and Robert G. Meyer, "Analysis and Design of Analog Integrated Circuits", Second Edition, John Wiley and Sons, 1984, pp. 293–296: as mentioned on p. 2 of the Specification.

*Primary Examiner*—Timothy P. Callahan
*Assistant Examiner*—Jung Ho Kim
*Attorney, Agent, or Firm*—Herbert L. Lerner; Laurence A. Greenberg

[57] ABSTRACT

A circuit configuration for generating a reference potential includes a first transistor with an emitter connected to a ground potential and a base and a collector connected to one another. A second transistor has a base connected to the base of the first transistor. A first resistor is connected between the collector of the first transistor and an output terminal for picking up the reference potential. A second resistor is connected between the collector of the second transistor and the output terminal. A third resistor is connected between the emitter of the second transistor and the ground potential. A third transistor has a base connected to the collector of the second transistor and an emitter connected to the ground potential. A controlled current source is connected between a supply potential and the output terminal and is coupled on the input side to the collector of the third transistor. A capacitor is connected parallel to the second resistor.

2 Claims, 1 Drawing Sheet

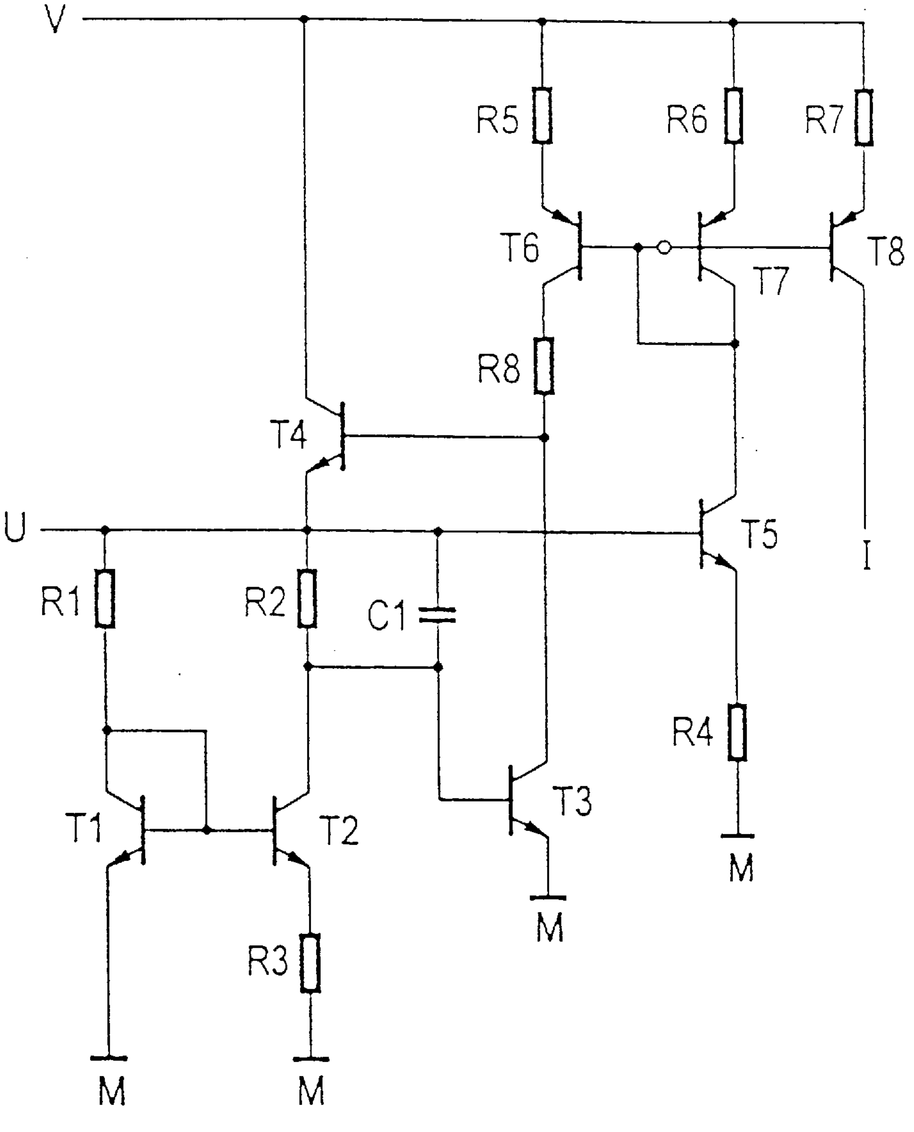
V
R5
R6
R7
T6
T7
T8
R8
T4
U
T5
I
R1
R2
C1
R4
T1
T2
T3
M
R3
M
M
M

CIRCUIT CONFIGURATION FOR GENERATING A REFERENCE POTENTIAL

BACKGROUND OF THE INVENTION

FIELD OF THE INVENTION

The invention relates to a circuit configuration for generating a reference potential, including a first transistor with an emitter connected to a ground potential and a base and a collector connected to one another; a second transistor with a base connected to the base of the first transistor; a first resistor connected between the collector of the first transistor and an output terminal for picking up the reference potential; a second resistor connected between the collector of the second transistor and the output terminal; a third resistor connected between the emitter of the second transistor and the ground potential; a third transistor with a base connected to the collector of the second transistor and an emitter connected to the ground potential, and a controlled current source connected between a supply potential and the output terminal and coupled on the input side to the collector of the third transistor.

One such circuit configuration, which is also known as a bandgap reference is known, for instance, from the book by Paul R. Gray and Robert G. Meyer, entitled: Analysis and Design of Analog Integrated Circuits, Second Edition, John Wiley and Sons, 1984, pp. 293–296 and from Published European Patent Application 0 411 657 A1, and is often used in integrated circuits as an internal reference voltage source. A frequency-compensated bandgap reference is also described in UK Patent Application GB 2 256 949 A.

In the future, it will become increasingly important in integrated circuits for the circuits to be able to be turned on and off through an external terminal, in order to save current. Turning them off should happen as fast as possible, in order to enable effective reduction in the current consumption and thus the power loss. The turn-on time should be kept as short as possible as well, in order to put the circuit into its operating state within the shortest possible time. A further important criterion of circuit configurations for generating a reference potential is their noise behavior. That can be favorably affected through the use of capacitors for bandgap limitation, which filter out the noise at high frequencies. However, those provisions lengthen the turn-on and turn-off times of the respective circuit.

SUMMARY OF THE INVENTION

It is accordingly an object of the invention to provide a circuit configuration for generating a reference potential, which overcomes the hereinafore-mentioned disadvantages of the heretofore-known devices of this general type and which has short turn-on and turn-off times despite good noise behavior.

With the foregoing and other objects in view there is provided, in accordance with the invention, a circuit configuration for generating a reference potential, comprising a first transistor having an emitter connected to a ground potential and having a base and a collector connected to one another; a second transistor having a base connected to the base of the first transistor and having an emitter and a collector; an output terminal for picking up a reference potential; a first resistor connected between the collector of the first transistor and the output terminal; a second resistor connected between the collector of the second transistor and the output terminal; a capacitor connected parallel to the second resistor; a third resistor connected between the emitter of the second transistor and the ground potential; a third transistor having a base connected to the collector of the second transistor, having an emitter connected to the ground potential and having a collector; a controlled current source connected between a supply potential and the output terminal and having an input side coupled to the collector of the third transistor, the controlled current source having a fourth transistor with a collector connected to the supply potential, an emitter connected to the output terminal and a base connected to the collector of the third transistor; and a further current source connected between the base and the collector of the fourth transistor, the further current source including a fifth transistor having a base connected to the output terminal and having an emitter and a collector; a fourth resistor connected between the emitter of the fifth transistor and the ground potential; a sixth transistor having a collector connected to the base of the fourth transistor, having a base coupled with the collector of the fifth transistor and having an emitter; a fifth resistor connected between the emitter of the sixth transistor and the supply potential; a seventh transistor having a base and a collector coupled to one another and to the collector of the fifth transistor and having an emitter; and a sixth resistor connected between the emitter of the seventh transistor and the supply potential.

It is advantageous that the favorable turn-on and turn-off times and the favorable noise behavior are attained with minimal technological effort or expense. To that end, the capacitor is connected parallel to the second resistor. As compared with a capacitor which is connected between the base and the emitter of the third transistor, for instance, the fourth transistor operated as an emitter follower can furnish more current and thus shortens the turn-on time. Conversely, the second resistor which is connected parallel to the capacitor contributes to shortening the turn-off time. The stability and noise behavior remain practically unchanged.

Finally, the operating voltage suppression at high frequencies is improved.

In accordance with a concomitant feature of the invention, there is provided an eighth resistor connected in series with the further current source, into the collector line of the sixth transistor. This has the advantage of further reducing the noise of the circuit configuration according to the invention. The noise of the further current source has an influence, especially at high frequencies, on the noise behavior of the entire circuit configuration. This is annoying, especially if pnp transistors are used in the further current source, because such transistors are far from being ideal transistors with respect to noise and the magnitude of the parasitic capacitance. The eighth resistor, especially at high frequencies, insulates the nonideal further current source and thus improves both the noise behavior and the output resistance. It also improves the stability, since the effective capacitance at the output of the further current source then does not affect the phase reserve of the entire circuit configuration to such a great extent. The insertion of a series resistor is recommended especially when the sixth and seventh transistors are constructed as pnp transistors at a current output of the circuit configuration.

Other features which are considered as characteristic for the invention are set forth in the appended claims.

Although the invention is illustrated and described herein as embodied in a circuit configuration for generating a reference potential, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a schematic diagram of a circuit according to the invention.

DESCRIPTION OF THE PREFERRED EMBODIMENTS

Referring now in detail to the single figure of the drawing, there is seen an exemplary embodiment of a circuit configuration in which a first npn transistor T1 has an emitter connected to a ground potential M and a base and a collector which are connected both to one another and through a common first resistor Ri to an output terminal U that carries a reference potential. A base of a second npn transistor T2 is connected to the base and the collector of the transistor T1. The npn transistor T2 has an emitter which is coupled through a third resistor R3 to the ground potential M and a collector which is coupled through a second resistor R2 to the output terminal U.

A fourth npn transistor T4 of a controlled current source has an emitter which is also connected to the output terminal U and a collector which is connected to a supply potential V. The transistor T4 also has a base which is connected to a collector of a third npn transistor T3. The npn transistor T3 has an emitter connected to the ground potential M and a base connected to the collector of the transistor T2. A capacitor C1 is connected parallel to the resistor R2.

The base of the transistor T4 is also connected through an eighth resistor R8 and a current source circuit to the supply potential V.

The current source circuit has a sixth pnp transistor T6 with an emitter coupled through a fifth resistor R5 to the supply potential V and a collector coupled through the resistor R8 to the base of the transistor T4 as well as to the collector of the transistor T3. A base of the transistor T6 is connected to a base and a collector of a seventh pnp transistor T7. An emitter of the pnp transistor T7 is coupled through a sixth resistor R6 to the supply potential V. The base and the collector of the transistor T7 and the base of the transistor T6 are moreover connected to a collector of a fifth npn transistor T5 of a further current source having the transistors T5, T6 and T7. The npn transistor T5 has an emitter connected through a fourth resistor R4 to the ground potential M and a base connected to the output terminal U.

Besides the output terminal U, at which the reference potential can be picked up, an output terminal I can also be provided, which carries a reference current. To that end, the output terminal I is connected to a collector of a pnp transistor T8. The pnp transistor T8 has an emitter connected through a resistor R7 to the supply potential V and a base connected to the bases of the transistors T6 and T7.

The capacitance of the capacitor C1 depends on the particular application. Once again, the noise behavior becomes more favorable at high capacitances, while the turn-on performance becomes more favorable at lower capacitances. The resistor R8 is selected to have the highest possible resistance, in order to assure the highest possible isolation.

I claim:

1. A circuit configuration for generating a reference potential, comprising:

a first transistor having an emitter connected to a ground potential and having a base and a collector connected to one another;

a second transistor having a base connected to the base of said first transistor and having an emitter and a collector;

an output terminal for picking up a reference potential;

a first resistor connected between the collector of said first transistor and said output terminal;

a second resistor connected between the collector of said second transistor and said output terminal;

a capacitor connected parallel to said second resistor;

a third resistor connected between the emitter of said second transistor and the ground potential;

a third transistor having a base connected to the collector of said second transistor, having an emitter connected to the ground potential and having a collector;

a controlled current source connected between a supply potential and said output terminal and having an input side coupled to the collector of said third transistor, said controlled current source having a fourth transistor with a collector connected to the supply potential, an emitter connected to said output terminal and a base connected to the collector of said third transistor; and a further current source connected between the base and the collector of said fourth transistor, said further current source including:

- a fifth transistor having a base connected to said output terminal and having an emitter and a collector;
- a fourth resistor connected between the emitter of said fifth transistor and the ground potential;
- a sixth transistor having a collector connected to the base of said fourth transistor, having a base coupled with the collector of said fifth transistor and having an emitter;
- a fifth resistor connected between the emitter of said sixth transistor and the supply potential;
- a seventh transistor having a base and a collector coupled to one another and to the collector of said fifth transistor and having an emitter; and
- a sixth resistor connected between the emitter of said seventh transistor and the supply potential.

2. The circuit configuration according to claim 1, including an eighth resistor connected in series with said further current source.

* * * * *